United States Patent
Wilson et al.

(10) Patent No.: US 10,109,997 B2
(45) Date of Patent: Oct. 23, 2018

(54) FAULT CURRENT LIMITER HAVING SELF-CHECKING POWER ELECTRONICS AND TRIGGERING CIRCUIT

(71) Applicant: Varian Semiconductor Equipment Associates, Inc., Gloucester, MA (US)

(72) Inventors: Adrian Wilson, Newcastle upon Tyne (GB); Arsen Babayan, Gloucester, MA (US); Herbert Piereder, Amsterdam (NL)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 267 days.

(21) Appl. No.: 15/048,072

(22) Filed: Feb. 19, 2016

(65) Prior Publication Data
US 2017/0244241 A1    Aug. 24, 2017

(51) Int. Cl.
    *H02H 9/02*    (2006.01)
    *H01H 9/54*    (2006.01)
    *H03K 17/13*    (2006.01)
    *H02H 3/087*    (2006.01)

(52) U.S. Cl.
    CPC .......... *H02H 9/025* (2013.01); *H01H 9/542* (2013.01); *H01H 9/541* (2013.01); *H01H 2009/544* (2013.01); *H02H 3/087* (2013.01); *H03K 17/13* (2013.01)

(58) Field of Classification Search
    USPC .................................. 361/2–13, 42, 86–87
    See application file for complete search history.

(56) References Cited

U.S. PATENT DOCUMENTS

| | | | |
|---|---|---|---|
| 2004/0027734 A1* | 2/2004 | Fairfax | H01H 9/542 361/2 |
| 2007/0091520 A1 | 4/2007 | Angelides et al. | |
| 2008/0007879 A1 | 1/2008 | Zaretsky et al. | |
| 2012/0007621 A1 | 1/2012 | Yue | |
| 2013/0264883 A1* | 10/2013 | Bhavaraju | H02J 3/383 307/80 |
| 2013/0314828 A1 | 11/2013 | Chen et al. | |
| 2014/0357490 A1 | 12/2014 | Takletsadik | |
| 2015/0293164 A1* | 10/2015 | Stephenson | G01R 31/025 324/509 |
| 2016/0202321 A1* | 7/2016 | Drame | G01R 31/3277 324/424 |

OTHER PUBLICATIONS

International Search Report and Written Opinion dated Apr. 20, 2017 from PCT application, PCT/US2017/012436 filed Jan. 6, 2017.

* cited by examiner

*Primary Examiner* — Danny Nguyen

(57) ABSTRACT

A fault current limiter may include a current limiting leg to transmit a first current and a control leg in parallel with the current limiting leg, the control leg to transmit a second current. The control leg may include a plurality of solid state switches arranged in electrical series with one another; a plurality of current monitors arranged in electrical series with the plurality of solid state switches; and at least one triggering circuit, wherein the plurality of current monitors are electrically coupled to the at least one triggering circuit, and wherein the at least one triggering circuit is optically coupled to the plurality of solid state switches.

15 Claims, 4 Drawing Sheets

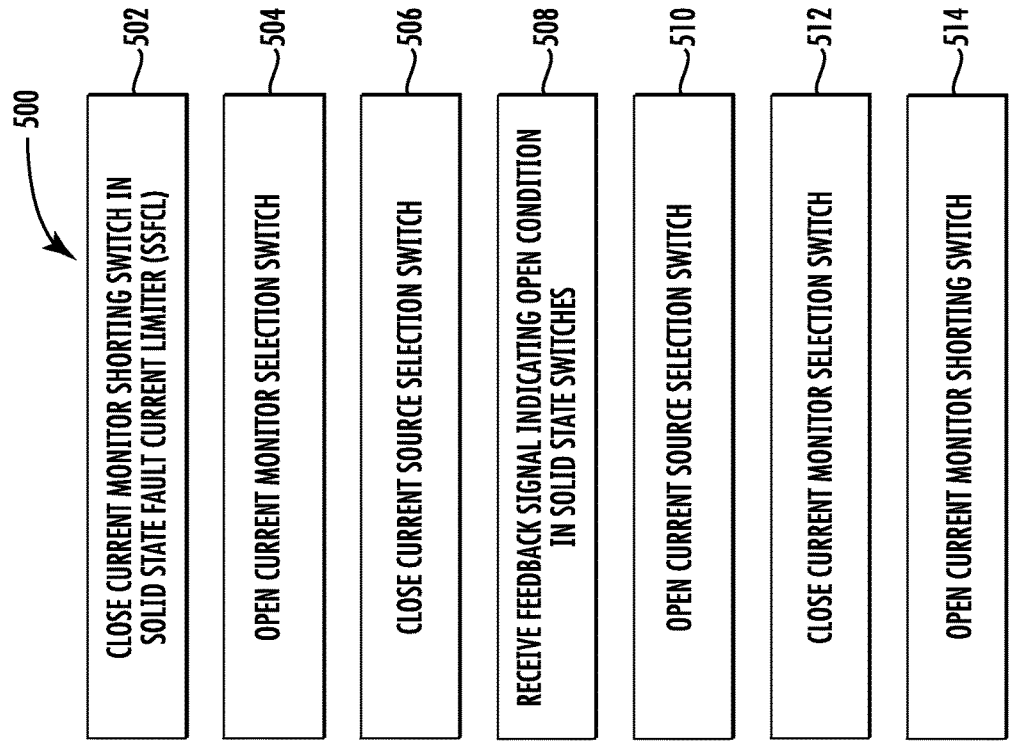
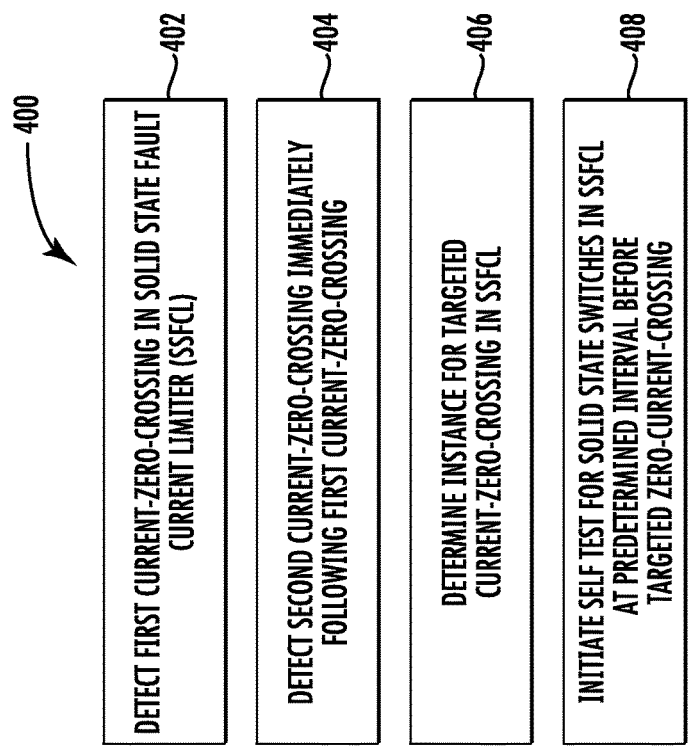

FAULT CURRENT LIMITER HAVING SELF-CHECKING POWER ELECTRONICS AND TRIGGERING CIRCUIT

FIELD

The present embodiments relate to current limiting devices and more particularly to solid state fault current limiters.

BACKGROUND

In the present day, solid state fault current limiters (SSFCL) are used to regulate current over transmission lines where transmission of currents of several thousand amps are common. SSFCL systems are designed to prevent excessive current in the event of a fault condition. In one design of an SSFCL, a mutual reactor is configured to split load current into a control leg and a limiting leg. The control leg may include power electronic switch(es) and may be designed to transmit a current well within the rating of power electronic switches, such as several hundred amps. The limiting leg may be designed to transmit several thousand amps and may be further designed with an adequate self-inductance to limit the prospective fault current to a desired safe level. Under normal conditions current flows in both legs of the mutual reactor, where the reactor is designed in this situation to have low losses. A circuit or similar component is provided to monitor the control current of the control leg, and to open the power electronic switch(es) when a current threshold (or other triggering scheme) is exceeded, so the mutual reactor becomes unbalanced, and the self-inductance of the limiting leg then reduces the current flowing in the limiting leg to a safe level.

One issue with the aforementioned design arises when solid state switches fail to short circuit. Since this circuit just opens the solid state switches on-fault, any failure of the solid state switches is just evident on demand for fault protection. The fault current limiter may include a fuse to protect against solid state switches failures or other component failures. One issue with fuse design is when the total current increases, the energy used to blow the fuse in the control leg may not be sufficient to protect a network from damaging first peak faults (i.e., at approximately 5 ms). Indeed, when the mutual reactor is designed to have less fault current let through than normal current (due to a high peak fault current reduction requirement for example), the fuse protection system can never work.

With respect to these and other considerations the present disclosure is provided.

BRIEF SUMMARY

In one embodiment, a fault current limiter may include a current limiting leg to transmit a first current and a control leg in parallel with the current limiting leg, the control leg to transmit a second current. The control leg may include a plurality of solid state switches arranged in electrical series with one another; a plurality of current monitors arranged in electrical series with the plurality of solid state switches; and at least one triggering circuit, wherein the plurality of current monitors are electrically coupled to the at least one triggering circuit, and wherein the at least one triggering circuit is optically coupled to the plurality of solid state switches.

In another embodiment, a method may include receiving a signal to initiate a self-test procedure at a trigger board of a fault current limiter. The method may further include initiating the self-test procedure in the trigger board after the receiving the signal.

In another embodiment, a fault current limiter may include a plurality of solid state switch modules arranged in electrical series with one another in a control leg and a plurality of current monitors arranged in electrical series with the plurality of solid state switches. The fault current limiter may further include at least one triggering circuit, wherein the plurality of current monitors are coupled to the at least one triggering circuit, and wherein the at least one triggering circuit is coupled to the plurality of solid state switch modules. The fault current limiter may additionally include a monitoring circuit coupled to the at least one triggering circuit.

BRIEF DESCRIPTION OF THE DRAWINGS

FIG. 4 presents an exemplary process flow according to additional embodiments of the disclosure.

FIG. 5 presents an exemplary process flow according to further embodiments of the disclosure.

DETAILED DESCRIPTION

Figure 1:
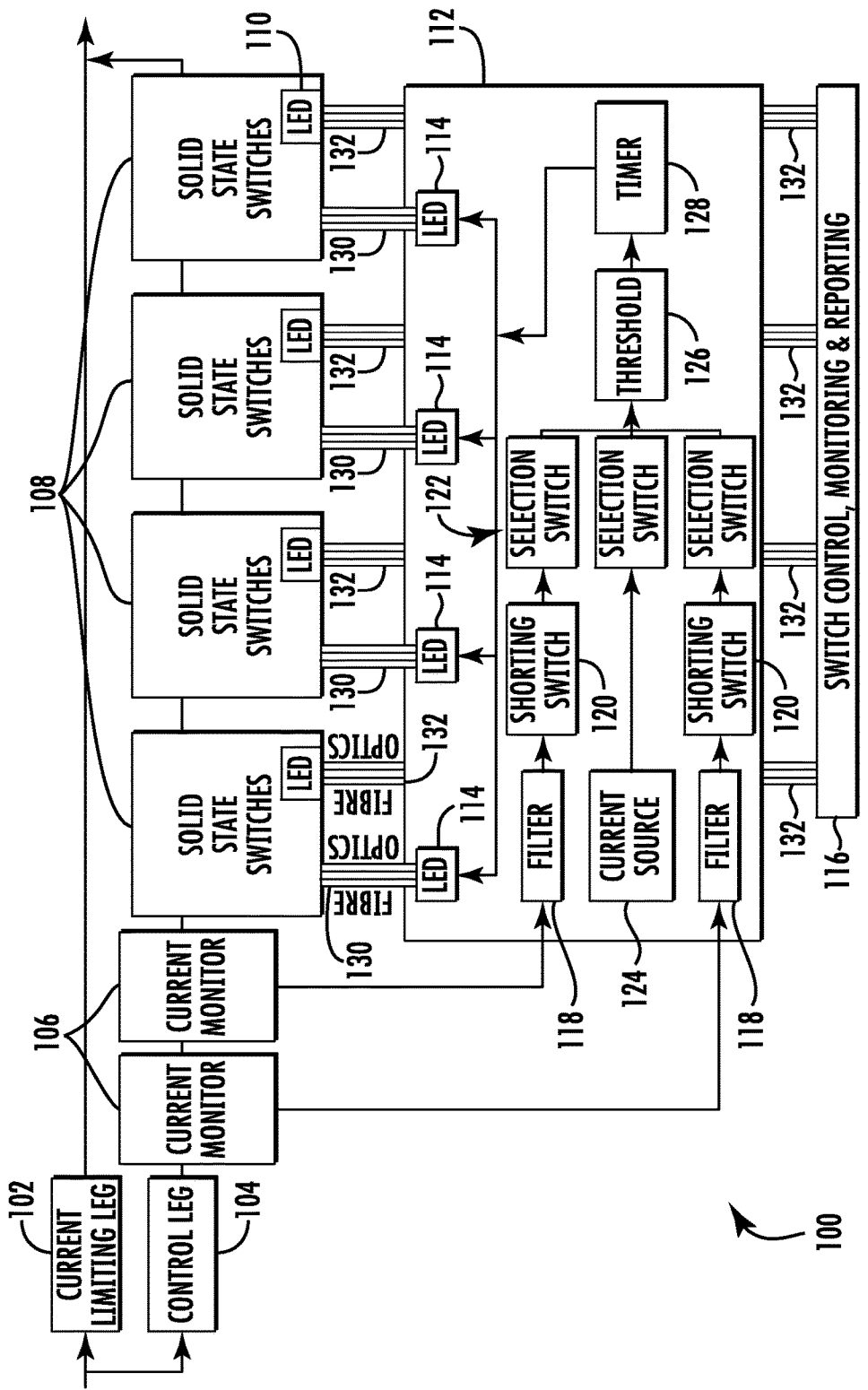
FIG. 1 presents an exemplary fault current limiter according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments involve apparatus, systems and methods for improved fault current protection. Various embodiments address issues related to failure on demand for fault protection by providing circuitry architecture and techniques to facilitate checking components of a fault current limiter including detection circuits and power electronics. Various embodiments provide a control leg of a fault current limiter including a plurality of current monitors arranged in electrical series with a plurality of solid state switches. In various embodiments a novel embodiments of the control leg is provided for controlling the plurality of solid state switches.

In some embodiments, a plurality of triggering circuits may be coupled to the plurality of solid state switches as detailed herein below. A given triggering circuit may be disposed on a dedicated triggering circuit board in some embodiments. The triggering circuit may be configured with multiple inputs to receive current signals from the plurality of current monitors, as well as a comparator circuit for comparing current signals received from the plurality of current monitors. The triggering circuit may further include a current source for testing as detailed below, as well as switches for allowing a test to be performed. Furthermore, the triggering circuit may include control logic to ensure a test is performed at a correct instance. In addition, the triggering circuit may include an input for running a self-test as well as an output for signaling a completion of a self-test. In various embodiments having multiple triggering circuits, a triggering circuit may further include a trigger input from an additional board as well as a trigger output to the additional board.

In various embodiments, a novel monitoring board is provided in a control leg of a fault current limiter where the monitoring board may be configured for feedback from solid state switches during a self-test. For example, the monitoring board may include a plurality of detectors optically coupled to the plurality of solid state switches. The monitoring board may further include a plurality of current inputs and a plurality of comparator signal inputs coupled to comparators located on a plurality of triggering boards. The monitoring board may further include a programmable test timer to control timing of a self-test. In addition, the monitoring board may include a manual "perform test" input, as well as a run self-test output. Moreover, the monitoring board may include an output to output the test status to an overall control system for a fault current limiter. In some embodiments, components to perform the triggering, testing and monitoring functions may be physically integrated into a single board.

FIG. 1 illustrates a fault current limiter 100 according to various embodiments of the disclosure. The fault current limiter 100 may be used to limit current along a transmission line or other current carrying path. The fault current limiter 100 may include a current limiting leg 102 to transmit a first current and a control leg to transmit a second current, where the second current can be much lower than the first current. For example, in normal operation the first current passing through the current limiting leg 102 may be in the range of a two thousand amps, three thousand amps, or more. The embodiments are not limited in this context. The control leg 104 may be configured to pass a current such as 200 A, 300 A, or similar value. The embodiments are not limited in this context. The fault current limiter 100 may be arranged as a solid state fault current limiter to include, in the control leg 104, a plurality of solid state switches arranged in electrical series with one another, shown as solid state switches 108. In some embodiments, these solid state switches may be insulated gate bipolar transistors (IGBT). The embodiments are not limited in this context. As used herein the term "solid state switch" may refer to a solid state switch module including a solid state switch such as an IGBT and associated circuitry, including interfaces such as signal receivers, light emitting diodes (LED) and other circuitry. The fault current limiter 100 may also include a plurality of current monitors 106 arranged in electrical series with the plurality of solid state switches 108. The current monitors 106 may be arranged in the control leg 104 as shown, or in the current limiting leg 102 or outside the fault current limiter 100. As further shown in FIG. 1, the fault current limiter 100 may also include at least one triggering circuit, shown as the triggering circuit 112, wherein the plurality of current monitors 106 are coupled to the triggering circuit 112, and wherein the triggering circuit 112 is coupled to the plurality of solid state switches 108.

In the example of FIG. 1 there are shown two current monitors, current monitors 106, where the use of two current monitors may supply redundancy to current detection along the control leg 104. A given triggering circuit, shown as triggering circuit 112, may include a threshold detector 126 electrically coupled to a first current monitor output of a first current monitor, shown as current monitor 106, and to a second current monitor output of a second current monitor, also shown as current monitor 106. The threshold detector 126 may be configured to determine when current being transmitted along the control leg exceeds a threshold, using current signals received from the current monitors 106. The triggering circuit 112 may be located on a triggering board, where the triggering board is set at a relatively low voltage with respect to ground, while other elements of the control leg 104, such as the solid state switches 108 are at relatively higher voltage, such as several thousand volts. Accordingly, the triggering circuit 112 may be optically coupled to the solid state switches 108, and may be in particular configured with light emitting diodes 114 to communicate signals to the solid state switches 108 as shown.

In operation, when the threshold detector 126 determines a current threshold has been exceeded the threshold detector 126 may send control signals along the optical links 130 to switch off the solid state switches 108, where the optical links 130 may be fiber optics. In the example shown there are four solid state switches 108, while in other embodiments a greater number or fewer solid state switches 108 may be employed. The number of solid state switches used may be based on the voltage sustained across the control leg 104 and the voltage rating of a given solid state switch. In cases of a voltage change of several thousand volts, the use of several solid state switches 108 in series may be appropriate because a given solid state switch may be able to operate at a maximum voltage across the switch of less magnitude than the total voltage change, for example. As further shown in FIG. 1, a first trigger light emitting diode (LED), shown as light emitting diode 114, may be electrically coupled to an output of the threshold detector via a timer 128, and may be optically coupled to a first solid state switch, shown as solid state switch 108. A second trigger LED, also shown as light emitting diode 114, may be electrically coupled to the output of the threshold detector 126 and optically coupled to a second solid state switch, also shown as solid state switch 108. Accordingly, a one-to-one correspondence of trigger LEDs (light emitting diodes 114) and solid state switches exists in the arrangement of FIG. 1.

The facilitate checking of problems or failures in power electronics or detection circuitry, the fault current limiter 100 may include a novel arrangement of additional components, where the operation of these components is detailed below. In particular, in addition to filters 118, where the filters 118 may perform as conventional filters, the triggering circuit 112 may include a current source 124 having a current source output to output a test current to the threshold detector 126, shorting switches 120, and selection switches 122. In particular, the shorting switches 120 may act to prevent the current monitor(s) reaching (a) high voltage(s) when disconnected from the threshold detector 126, while the selections switches 122 may select between the current source or the current monitor(s).

As shown in FIG. 1, the triggering board 122 may include a first filter, shown as filter 118 and having a first filter input to receive a first current monitor output from a first current monitor, shown as current monitor 106. The first filter may also have a first filter output used to connect to a shorting switch 120. Additionally, the triggering board 122 may include a second filter, also shown as filter 118 and having a second filter input to receive a second current monitor output from a second current monitor, also shown as current monitor 106. The second filter may also have a second filter output used to connect to another shorting switch, also shown as shorting switch 120. In turn, the first shorting switch may have a first shorting switch output used to connect to a first selection switch, shown as selection switch 122, while the second shorting switch may have a second shorting switch output used to connect to a second selection switch, also shown as selection switch 122. In turn, the first selection switch may have a first selection switch output coupled to a threshold detector input and the second selection switch may have a second selection switch output coupled to the threshold detector input as shown.

The fault current limiter 100 may further include a monitoring circuit 116 coupled to the triggering circuit 112. In various embodiments, the monitoring circuit 116 may include a plurality of inputs coupled to the plurality of current monitors, i.e., current monitors 106. The monitoring circuit 116 may also include a programmable test timer (not shown) as well as at least one comparator input to receive a comparator signal. The comparator input (not shown) may be coupled to a comparator (not shown in FIG. 1) in the triggering circuit 112, where the comparator is further coupled to the plurality of current monitors, i.e., the current monitors 106.

As further shown in FIG. 1, the monitoring circuit 116 may be optically coupled to the solid state switches 108 along the optical links 132. In particular a given solid state switch may include a light emitting diode 110 to send signals to the monitoring circuit 116.

Figure 2:
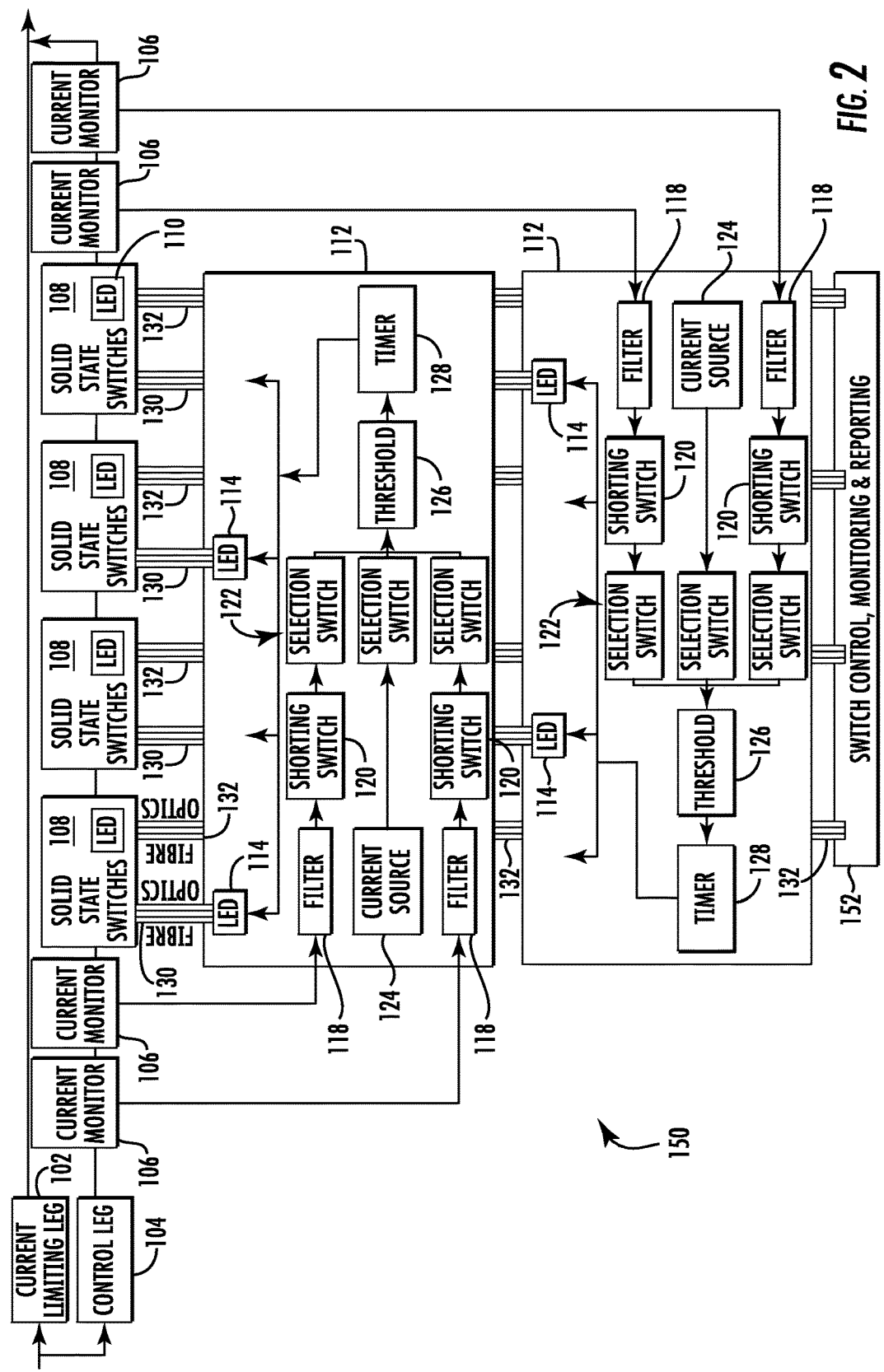
FIG. 2 presents another exemplary fault current limiter according to other embodiments of the disclosure.

FIG. 2 illustrates another fault current limiter 150 according to further embodiments of the disclosure. In this example, the fault current limiter may include two triggering circuits, where a given triggering circuit, shown as triggering circuit 112, is coupled to a pair of current monitors, shown as current monitors 106. A total of four current monitors are thus accommodated by the two triggering circuits. While the current monitors 106 are shown as a pair of current monitors on a first end of the solid state switches 108 and a second pair of current monitors arranged on a second end of the solid state switches 108, the current monitors 106 may be arranged in any fashion placing the current monitors 106 in electrical series with the solid state switches 108. In this topology of FIG. 2, a first triggering circuit and a second triggering circuit are arranged so a first solid state switch and a third solid state switch are optically coupled to the first triggering circuit (top triggering circuit) and a second solid state switch and a fourth solid state switch are optically coupled to the second triggering circuit (bottom triggering circuit). However, other topologies are possible for coupling multiple triggering circuits to solid state switches. A given solid state switch may include a light emitting diode 110 to output a signal along the optical link 132, where the signal is received by the monitoring circuit 152. In the topology of FIG. 2 the fault current limiter 150 is arranged so two of the solid state switches 108 receive control signals from one of the triggering circuits 112, and another two of the solid state switches 108 receive signals from the other of the triggering circuits 112. All of the solid state switches 108 are optically coupled to the monitoring circuit 152, allowing the current state of all the solid state switches 108 to be monitored.

Figure 3:
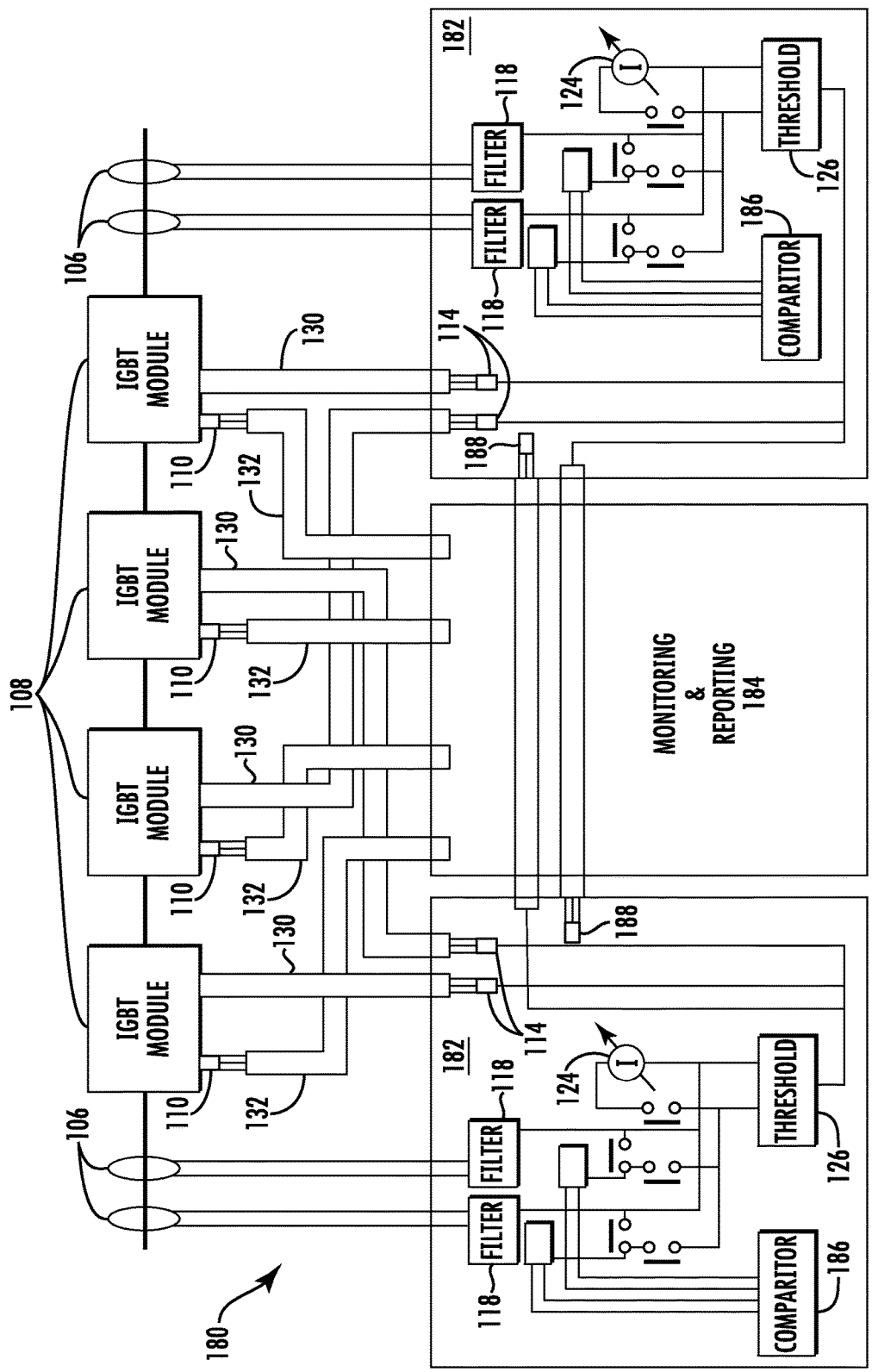
FIG. 3 presents an exemplary control leg of a fault current limiter according to further embodiments of the disclosure.

FIG. 3 provides another embodiment of a control leg 180 of a fault current limiter. In this embodiment as in the embodiment of FIG. 2, two triggering circuits 182 are provided, where a given triggering circuit is coupled to two of the current monitors 106, as well as to a monitoring circuit 152. As suggested in FIG. 3, the current monitors 106 may be configured as known transformer type devices where current is sensed by induction. Also shown in the triggering circuit 182 is a comparator 186 coupled to both of the filters 118 within the triggering circuit. Accordingly, the comparator 186 may compare signals generated from both of the current monitors 106. As shown in FIG. 3, a triggering circuit 182 may communicate with the other of the triggering circuits 182 via a device 188, such as an LED.

In operation, the embodiments of FIGS. 1-3 provide for self-testing of different components of a fault current limiter while not being unduly burdensome to operation of the fault current limiter. In various embodiments a self-test may be initiated manually using a user interface such as a push button, a control room signal or other mechanism. In other embodiments a self-test signal may be generated by a timer, such as a programmable test timer, where the self-test is generated periodically, such as at a regular interval. Once a self-test signal is initiated, an instruction may be sent to a given circuit, where the circuit may reside in a control board. The control board receiving the self-test signal may then initiate the self-test.

In some embodiments, the self-test may include a test sequence beginning by performing an operation of detecting an immediate current-zero-crossing point in the control leg, where the zero current crossing occurs at intervals according to the frequency of alternating current passing through the fault current limiter. In a subsequent operation, the next or subsequent current-zero-crossing point is detected. This may allow logic in the circuit, such as a triggering circuit to predict the intervals when subsequent current-zero-crossing points take place.

FIG. 4 presents an exemplary process flow 400 according to embodiments of the disclosure. At block 402 the operation is performed to detect a first current-zero-crossing in a solid state fault current limiter (SSFCL). At block 404 the operation of detecting a second current-zero-crossing immediately following the first current-zero-crossing is performed. At block 406 the operation is performed of determining an instance for a targeted current-zero-crossing in the SSFCL. At block 408 a signal is sent to initiate a self-test for solid state switches in the SSFCL at a predetermined interval before a targeted zero-current-crossing event. For example, a zero-current crossing may take place every 20 ms while the self-test may be initiated approximately 50 μs before a targeted current-zero-crossing.

FIG. 5 presents another exemplary process flow 500 according to additional embodiments of the disclosure. At block 502 a current monitor shorting switch of a fault current limiter is closed. The current monitor shorting switch may be coupled to a current monitor of the fault current limiter and may be closed at a predetermined interval before a next current-zero-crossing. At block 504 a given current monitor selection switch is opened. The given current monitor selection switch may be one among a plurality of current monitor selection switches coupled to a plurality of current monitors of the fault current limiter, where the given current monitor selection switch is closed prior to the instance of the operation of block 504. At block 506 a current source selection switch may be closed. The closing of the current source selection switch may result in the flowing of a triggering current. This may result in the opening of solid state switches in a control leg of the fault current limiter. At block 508 a feedback signal (open circuit confirmation signal) is received from the solid state switches indicating an open condition in the solid state switches. At block 510 the current source selection switch is opened. At block 512, the current monitor selection switch is closed. At block 514 the current monitor shorting switch is opened.

While in the aforementioned embodiments, a triggering board may receive a monitored current from current monitors of a control leg, in additional embodiments, a resistor may be provided as part of a current monitor. In these embodiments monitored current of the control leg is transformed into a voltage via the resistor and is sent to the triggering board as a voltage. In such embodiments, the current source of a triggering board may be replaced by a voltage source, where a threshold detector detects when a threshold voltage is exceeded instead of current. In these embodiments a shorting switch may be omitted from a triggering board. Additionally, the triggering board may include a rectifier to rectify the input alternating current (AC) voltage received from the current monitor. Accordingly, in normal operation, the triggering board may send signals to open the solid state switches of the control leg when a threshold voltage is exceeded. Moreover, in these embodiments, where current monitor shorting switches are not include, a self-test procedure may accordingly omit the closing and opening of current monitor shorting switches.

Table I. presents an exemplary summary of operations performed in a self-test according to some embodiments of the disclosure. The operations may apply for testing components of a first triggering circuit (triggering board) and the solid state switches controlled by the triggering board. In this example, the following assumptions are made: The solid state switches of the fault current limiter are IGBTs. A propagation delay of 8 μs is assumed (including switching of an IGBT). A relay switching time takes 15 μs and an IGBT control card feedback time is 20 μs. These values may of course differ depending upon the exact components used in a fault current limiter, and are shown primarily for illustration purposes. The reference times are shown with respect to a given interval before a next current-zero-crossing event is calculated to occur. In various embodiments, the operations shown in table I. are performed by self-test logic, where the self-test logic may be embodied in hardware circuitry, a combination of hardware circuitry and software, or software.

As shown in Table I, at −20 ms and −10 ms two instances of current-zero crossing are initially monitored as described above. This monitoring allows the next current-zero-crossing instance to be predicted to occur at 0 s so a self-test may be launched some tens of microseconds before the next current-zero-crossing. In particular, a first operation of a self-test sequence takes place at 'zero-78 μs' (with respect to the next current-zero-crossing), where a current monitor shorting switch (shorting switch 120) is closed, so as to avoid a large voltage being induced by a current transformer. In a subsequent operation, at −63 μs, a current monitor selection switch (a selection switch of the selection switches 122, either a top or bottom switch, depending upon whichever is closed) is opened, so as to stop a current source circulating current through the current monitor shorting switch (shorting switch 120). In a subsequent operation, at −48 μs, a current source selection switch (selection switch 122, middle) is closed, followed by flowing of a triggering current at −33 μs. The triggering circuit will sense this current and cause the IGBTs to open some 8 μs later once the signal has propagated. At −5 μs an IGBT on-board gate driver circuit confirms a circuit is open via a feedback transmitted over an optical link from an IGBT's gate firing card. Also at this time, the current source selection switch (selection switch 122, middle) is caused to open, causing the triggering circuit to no longer be over the threshold and causing the IGBTs to switch back on. By the instance corresponding to +18 μs, accounting for the propagation delay, the IGBTs are now switched on. At +10 μs the current monitor selection switch is closed. At +25 μs the current monitor shorting switch is opened. At +40 μs a "self-test completed" signal is sent, while at +60 μs a "self-test completed" signal is removed.

As further shown in Table I. in accordance with this embodiment, current interruption lasts for 51 μs while the fault current limiter remains unprotected for 118 μs. In this manner, the operation of various IGBTs may be periodically checked without unduly interfering with operation of a fault current limiter.

TABLE I

| Time | Control Operation | Action | Power off time | Non-protect time |
|---|---|---|---|---|
| −20 ms | Detect current zero crossing | | | |
| −10 ms | Detect current zero crossing | Determine time of next zero current crossing | | |
| Zero − 78 μs | Close current monitor shorting switch | Closing | | |
| | | | | 15 μs |
| Zero − 63 μs | Open current monitor selection switch | Opening | | |
| | | | | 30 μs |
| Zero − 48 μs | Close current source selection switch | Closing | | |
| | | | | 45 μs |
| Zero − 33 μs | | Current from the source exceeds the threshold and switches off the IGBTs | 8 μs | |
| Zero − 25 μs | | IGBTs open   IGBT feedback status updates | 23 μs | 53 μs 73 μs |
| Zero − 5 μs | Read IGBT feedback Open current source selection switch | Opening | | |
| | | | 38 μs | 88 μs |
| Zero + 10 μs | Read IGBT feedback Close the current monitor selection switch | Closing   Threshold no longer exceeded. IGBTs closing IGBTs closed | 43 μs 51 μs | |
| Zero + 18 μs | | | | 103 μs |
| Zero + 25 μs | Open the current monitor shorting switch | Opening | | |
| | | | | 118 μs |

TABLE I-continued

| Time | Control Operation | Action | Power off time | Non-protect time |
|---|---|---|---|---|
| Zero + 40 µs | Self test completed signal sent | Signal goes high | | |
| Zero + 60 µs | Self-test completed signal removed | Signal goes low | | |

In accordance with various embodiments, after a self-test is completed for a first triggering board, the self-test may be initiated for a second triggering board. The results may then be stored and reported. For example, the results of a self-test may indicate proper operation of the IGBTs or alternatively a failure in operation of at least one IGBT, such as a failure to open. This may allow timely corrective action to be taken as needed.

As noted, according to the above example, the power electronics may be opened for approximately 51 µs about an instance of a current-zero. If the solid state switch modules are operating in conjunction with a mutual reactor, the mutual reactor will enter its high impedance state for this period of time and current will continue to flow. If the solid state switch modules are in a stand-alone configuration then the current will be interrupted for the duration. Notably, an advantage of this procedure is because this power outage is so short and the power being delivered so low where no practical consequences will occur on grid connected loads. As further indicated, the test process will leave a fault current limiter circuit unprotected with one of the control boards for approximately 118 µs about an instance of a current-zero. The technique described for this example will be suitable for peak currents up to 236 kA. This limit should be suitable for all practical applications. The table II. shown below provides a practical example where 76% limiting is targeted, a typical board rating and the maximum current above which current a solid state device switch off current would be exceeded.

TABLE II

| Prospective Peak Fault current | Maximum allowable peak | Peak at 118 µs | Solid State current at 118 µs (7:1 mutual reactor) | Solid state switch off current |
|---|---|---|---|---|
| 20.83 kA | 5.83 kA | 388 A (50 Hz) | 55 A | 251 A |
| 100 kA | | 2,223 A (60 Hz) | 317 A | 251 A |
| 236 kA | | 5,247 A (60 Hz) | 750 A | 251 A |

In summary various embodiments including redundant circuits for current transformers and cross triggering from the control boards provide advantages including a sufficiently robust system to ensure a network is always protected, and provide another advantage of a convenient means to monitor status of solid state switches within a fault current limiter without affecting operation of the fault current limiter.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A fault current limiter, comprising
a current limiting leg to transmit a first current;
a control leg in parallel with the current limiting leg, the control leg to transmit a second current, the control leg comprising:
   a plurality of solid state switches arranged in electrical series with one another;
   a plurality of current monitors arranged in electrical series with the plurality of solid state switches; and
   at least one triggering circuit, wherein the plurality of current monitors are electrically coupled to the at least one triggering circuit, and wherein the at least one triggering circuit is optically coupled to the plurality of solid state switches.

2. The fault current limiter of claim 1, further comprising a monitoring circuit coupled to the at least one triggering circuit.

3. The fault current limiter of claim 1, wherein the at least one triggering circuit comprises:
   a threshold detector, the threshold detector being indirectly electrically coupled to a first current monitor output of a first current monitor and to a second current monitor output of a second current monitor;
   a first trigger light emitting diode (LED) electrically coupled to an output of the threshold detector and optically coupled to a first solid state switch of the plurality of solid state switches; and
   a second trigger light emitting diode (LED) electrically coupled to the output of the threshold detector and optically coupled to a second solid state switch of the plurality of solid state switches.

4. The fault current limiter of claim 3, wherein the at least one triggering circuit further comprises:
   a first filter having a first filter input coupled to the first current monitor output from the first current monitor, and further having a first filter output;
   a second filter having a second filter input coupled to the second current monitor output from the second current monitor, and further having a second filter output;
   a first shorting switch coupled to the first filter output and having a first shorting switch output;
   a second shorting switch coupled to the second filter output and having a second shorting switch output;
   a first selection switch coupled to the first shorting switch output, and having first selection switch output; and a second selection switch coupled to the second shorting switch output and having a second selection switch output, wherein the threshold detector comprises a threshold detector input coupled to the first selection switch output and the second selection switch output.

5. The fault current limiter of claim 3, further comprising a timer coupled to the output of the threshold detector and having an output coupled to the first trigger LED and the second trigger LED.

6. The fault current limiter of claim 4, the at least one triggering circuit further comprising:
a current source having a current source output; and
a third selection switch coupled to the current source output and having a third selection switch output coupled to the threshold detector.

7. The fault current limiter of claim 2, wherein the plurality of solid state switches comprises: a first solid state switch including a first LED optically coupled to the monitoring circuit, and a second solid state switch including a second LED optically coupled to the monitoring circuit.

8. The fault current limiter of claim 2, wherein the monitoring circuit includes:
a plurality of inputs coupled to the plurality of current monitors, respectively;
a programmable test timer; and
at least one comparator input to receive a comparator signal, wherein a comparator input is coupled to a comparator in the at least one triggering circuit, and wherein the comparator is further coupled to the plurality of current monitors.

9. The fault current limiter of claim 1, wherein the plurality of solid state switches comprises four solid state switches arranged in electrical series, wherein the plurality of triggering circuits comprises a first triggering circuit and a second triggering circuit, wherein a first solid state switch and a third solid state switch are optically coupled to the first triggering circuit and a second solid state switch and a fourth solid state switch are optically coupled to the second triggering circuit.

10. The fault current limiter of claim 9, wherein the plurality of solid state switches are arranged so the first solid state switch is directly connected to the second solid state switch, the second solid state switch is directly connected to the third solid state switch, and the third solid state switch is directly connected to the fourth solid state switch.

11. A method, comprising:
receiving a signal to initiate a self-test procedure at a trigger board of a fault current limiter; and
after the receiving the signal, initiating the self-test procedure in the trigger board,
wherein the self-test procedure comprises:
detecting an immediate current-zero-crossing point;
detecting a next current-zero-crossing point; and
initiating a test sequence before a calculated time for a subsequent current-zero-crossing point,
wherein the test sequence comprises:
opening a current monitor selection switch;
closing a reference source selection switch;
generating a signal to switch off a solid state switch in the fault current limiter after a delay interval subsequent to the closing the current source selection switch;
receiving an open circuit confirmation signal from a circuit coupled to the solid state switch;
opening the reference source selection switch;
switching on the solid state switch; and
closing the current monitor selection switch.

12. The method of claim 11, wherein the reference source selection switch is coupled to a current source, the method further comprising:
before the opening a current monitor selection switch, closing a current monitor shorting switch; and
after the closing the current monitor selection switch, opening the current monitor shorting switch.

13. A fault current limiter, comprising:
a plurality of solid state switch modules arranged in electrical series with one another in a control leg;
a plurality of current monitors arranged in electrical series with the plurality of solid state switch modules;
at least one triggering circuit, wherein the plurality of current monitors are coupled to the at least one triggering circuit, and wherein the at least one triggering circuit is coupled to the plurality of solid state switch modules; and
a monitoring circuit coupled to the at least one triggering circuit,
wherein the at least one triggering circuit comprises:
a threshold detector, the threshold detector being indirectly electrically coupled to a first current monitor output of a first current monitor and to a second current monitor output of a second current monitor;
a first trigger light emitting diode (LED) electrically coupled to an output of the threshold detector and optically coupled to a first solid state switch of the plurality of solid state switch modules; and
a second trigger light emitting diode (LED) electrically coupled to the output of the threshold detector and optically coupled to a second solid state switch of the plurality of solid state switch modules.

14. The fault current limiter of claim 13, wherein the at least one triggering circuit further comprises:
a first filter having a first filter input coupled to the first current monitor output from the first current monitor, and further having a first filter output;
a second filter having a second filter input coupled to the second current monitor output from the second current monitor, and further having a second filter output;
a first selection switch coupled to the first filter output, and having first selection switch output; and
a second selection switch coupled to the second filter output and having a second selection switch output, wherein the threshold detector comprises a threshold detector input coupled to the first selection switch output and the second selection switch output.

15. The fault current limiter of claim 13, wherein at least one solid state switch module of the plurality of solid state switch modules comprises a light emitting diode coupled along an optical link to the monitoring circuit.

* * * * *